United States Patent [19]
Sato

[11] Patent Number: 5,685,950
[45] Date of Patent: Nov. 11, 1997

[54] DRY ETCHING METHOD

[75] Inventor: Junichi Sato, Tokyo, Japan

[73] Assignee: Sony Corporation, Tokyo, Japan

[21] Appl. No.: 680,103

[22] Filed: Jul. 15, 1996

Related U.S. Application Data

[63] Continuation of Ser. No. 362,917, Dec. 23, 1994, abandoned.

[30] Foreign Application Priority Data

Dec. 29, 1993 [JP] Japan .................. 5-355387

[51] Int. Cl.$^6$ .................................................. H01L 21/00
[52] U.S. Cl. ..................... 156/643.1; 156/646.1; 156/662.1
[58] Field of Search ............................ 156/643.1, 646.1, 156/662.1

[56] References Cited

U.S. PATENT DOCUMENTS

| | | | |
|---|---|---|---|
| 4,450,042 | 5/1984 | Purdes | 156/643.1 |
| 4,784,720 | 11/1988 | Douglas | 156/643.1 |
| 4,943,344 | 7/1990 | Tachi et al. | 156/643.1 |
| 5,007,982 | 4/1991 | Tsou | 156/643.1 |
| 5,078,833 | 1/1992 | Kadomura | 156/643.1 |
| 5,228,950 | 7/1993 | Webb et al. | 156/657.1 X |
| 5,266,154 | 11/1993 | Tatsumi | 156/345 X |
| 5,316,616 | 5/1994 | Nakamura et al. | 156/643.1 |
| 5,318,665 | 6/1994 | Oikawa | 156/643.1 |

FOREIGN PATENT DOCUMENTS 167825   7/1991   Japan .

*Primary Examiner*—Thi Dang
*Attorney, Agent, or Firm*—Hill, Steadman & Simpson

[57] ABSTRACT

A dry etching method is disclosed in which a first polysilicon layer is etched, using an ECR plasma of an etching gas containing a bromine-based gas and a rare gas, as a sidewall protective film is formed by a deposit mainly composed of SiBr, for forming a tapered gate electrode. Since SiBr$_x$ is efficiently generated by a radical reaction of Br$^*$ assisted by an ion-assist mechanism by the rare gas, and has a long residence time under a low gas pressure, it can be deposited efficiently on a patterned sidewall surface. Since the sidewall protective film produced with the present dry etching method, is free of SiO$_x$, particle contamination may be diminished. Since post-processing of a shorter time duration suffices for removing the sidewall protective film, erosion of the gate insulating film is not produced. Thus the semiconductor device having the fine multi-layer interconnection structure may be improved in reliability and yield.

12 Claims, 5 Drawing Sheets

DRY ETCHING METHOD

This is a continuation of application Ser. No. 08/362,917, filed Dec. 23, 1994, now abandoned.

BACKGROUND OF THE INVENTION

This invention relates to a dry etching method employed in fine processing for the fabrication of semiconductor devices. More particularly, it relates to a dry etching method for diminishing particle contamination and improving underlying layer selectivity in a taper processing of a layer of a silicon-based material.

Among the critical etching processes in the field of production of semiconductor devices is the dry etching of the layer of the silicon-based material. The polysilicon layer, typical of the layer of the silicon-based material, is employed in a gate electrode of a MOS-FET or as a transfer electrode for a CCD. Since the processing accuracy of these electrodes directly influences the device performance, extremely high processing accuracy and underlying layer selectivity or low damaging properties are required of the dry etching.

Recently, bromine (Br) based gases are taking the place of chlorofluoro carbon gases hitherto employed as etching gases for etching the layer of the silicon-based material. The reason is that, under the present-day tendency towards an extremely thin thickness of the $SiO_x$ layer constituting the insulating layer underlying the electrode, the bromine-based etchant exhibits essentially high selectivity with respect to the $SiO_x$ layer. Since a comparison of the interatomic binding energy reveals that the energy of the Si-Br bond (368 kJ/mol) is far weaker than that of the Si-O bond (464 kJ/mol), and since the bromine-based etchant is of such a size that it cannot easily intrude into the crystal lattice of $SiO_x$, it is theoretically not possible for the Br-based etchant to etch the $SiO_x$ layer by a spontaneous chemical reaction. On the other hand, the fact that the spontaneous chemical reaction is not possible means that high anisotropic etching under the ion-assisted mechanism becomes possible. This also represents a significant merit for the Br-based etchant.

It is generally felt that high processing accuracy proper to dry etching can be achieved by anisotropic etching. However, in multi-layer interconnection, it becomes occasionally necessary to intentionally taper the cross-sectional profile of the lower patterned interconnection layer and to precisely control the taper angle with a view to improving step coverage of the upper patterned interconnection layer ascribable to the step in the lower patterned interconnection layer and to prevent generation of etching residues. The reason therefor is now explained.

FIG. 1 shows the state in which a patterned lower polysilicon interconnection layer 13a is formed on a thin $SiO_x$ gate oxide film 12, which is on a Si substrate 11, a second gate oxide layer 14 and a second upper polysilicon interconnection layer 15 are formed for covering the entire surface of the first gate oxide film 12, and a resist mask 18 for etching the upper layer 15 has been formed on the layer 15 so that portions of the second upper polysilicon layer 15 are left on both sides of the step, which is formed by the portion 13a. The postscript a herein means that the pattern in subject is anisotropic.

If the upper interconnection layer 15 is etched under this condition by RIE, a residue 15s of the second polysilicon layer, which is called a stringer, is left on the sidewall surface of the patterned lower interconnection layer 13a, although the patterned upper interconnection layer 15a is etched to produce a vertical wall surface. The reason is that, since the film thickness in the vertical direction of the upper interconnection layer 15 at the step region is larger than the film thickness of the horizontal section of the upper interconnection layer 15, it is not possible to remove the etched layer in the step region in its entirety with RIE in which the etch rate in the vertical direction is maintained to be equal for any area on the substrate.

This residue 15s, if left over, tends to induce shorting with other portions of the patterned upper interconnection layer 15a formed in, for example, a direction perpendicular to the drawing paper. Thus it is necessary to remove the residue 15s by over-etching. It is however difficult to maintain high underlying layer selectivity in the course of the step of removing the residue 15s left due to a larger thickness at the step region, such that the second gate oxide film 14 is eroded to produce the eroded second gate oxide film 14e, as shown in FIG. 3. Such erosion of the second gate oxide film 14 leads to deterioration in dielectric strength. The postscript e herein means erosion.

The taper etching of the patterned lower interconnection layer represents an effective measure for preventing the erosion of the second gate oxide film 14. That is, the tapered etching of the lower patterned interconnection layer leads to diminished film thickness difference between the horizontal section of the upper interconnection layer 15 and the step region, as a result of which the amount of generation of the residue 15s may be diminished and overetching may be completed in a shorter time.

The method of taper etching the lower patterned interconnection layer by RIE employing a mixed gas composed of oxygen and a reaction gas containing bromine or hydrogen bromide is disclosed in JP Patent Kokai (Laid-Open) Publication 2-89310 (1990). With this method, the Si etching reaction for yielding $SiBr_x$ and the oxidation reaction for yielding $SiO_x$ are allowed to proceed in parallel at a desired proportion and the Si layer is taper-etched as the effective etching mask width is gradually increased by taking advantage of $SiO_x$ deposited on the sidewall surface of the pattern, which is subject to ion incidence to a lesser extent.

If this method is employed for etching the above-mentioned lower interconnection layer 13, a resist mask iT is formed on a lower interconnection layer 13 formed of a first polysilicon layer, and the lower interconnection layer 13 is etched using an $HBr/O_2$ gas mixture described in the above Kokai Publication, as shown in FIG. 4. Etching then proceeds while a sidewall protection film 18 composed mainly of $SiO_x$ is formed on the pattern sidewall surface, as shown in FIG. 5, until ultimately a patterned lower interconnection layer 13t having tapered profile is produced. The taper angle of the patterned lower interconnection layer 13t may be changed depending on the addition ratio of $O_2$ in the gas mixture.

The JP Patent Kokai Publication 2-98925 (1990) discloses the method of alternately repeating the process of etching an Si layer using a plasma of a reaction gas containing bromine or hydrogen bromide and the process of oxidizing the exposed surface of the Si layer using an oxygen plasma. This method enables taper processing based on the above principle.

However, with the above methods disclosed in the above two Kokai Publications, since $SiO_x$ is deposited on the patterned sidewall surface, the risk is high that particle contamination by $SiO_x$ in the etching reaction system will be increased. Under the recent highly refined design rule, such particle contamination which possible leads to lowered yield and reliability of the semiconductor devices, presents a serious problem.

In connection with difficulties involved in removing the sidewall protection film 18, deterioration in underlying layer selectivity similarly presents a problem. Specifically, while the resist mask 17 is removed by ashing after the end of the etching using the oxygen plasma, the sidewall protection film 18 composed mainly of $SiO_x$ cannot be removed by ashing. However, the sidewall protective film 18, if left over, is deleterious in connection with step coverage at the time of covering the patterned lower interconnection layer 13t with an insulating film. Thus it becomes necessary to remove the sidewall protective film 18 using plasma processing employing dilute hydrofluoric acid or a fluorine-based gas. However, the first gate oxide film 12e, formed of $SiO_x$, is simultaneously eroded, as shown in FIG. 6, thus possibly leading to deteriorated dielectric strength.

SUMMARY OF THE INVENTION

It is therefore an object of the present invention to resolve the above problems and to provide a dry etching method wherein reduction in particle contamination and improved underground selectivity may be achieved at the same time that taper processing of the layer of the silicon-based material may be carried out satisfactorily.

According to the present invention, there is provided a method for dry etching of a layer of a silicon-based material comprising the steps of forming a mask layer on the layer of the silicon-based material for exposing an area to be etched, and etching the exposed area, using an ECR plasma generated from an etching gas containing at least a bromine-based gas and a rare gas, at the same time as a deposit composed mainly of silicon bromide is deposited on a sidewall generated by etching.

For the bromine-based gas, HBr, $Br_2$ or $BBr_3$ may be employed. Of these, $Br_2$ is employed in a gasified state produced by gasifying means, such as He gas bubbling.

An oxygen-based gas may be added to the etching gas. Such oxygen-based gas may typically be $O_2$, $O_3$ or $H_2O$. Since the present invention is aimed at reducing particle contamination and removing the deposit after the etching, it is critical to suppress the amount of addition of the oxygen-based gas to a lower level in order not to permit deposition of $SiO_x$ in preference to that of $SiBr_x$.

The fact that the tapered cross-sectional shape of the pattern of the layer of the silicon-based material results from the above etching is highly effective to moderate the step difference of the substrate surface and to diminish film thickness difference in the overlying upper interconnection layer.

According to the present invention, the deposit mainly composed of $SiBr_x$ is formed on the etched area highly efficiently in the ECR plasma. This is related with the gas pressure under which the ECR plasma etching usually proceeds, and with the gas resonant time. The working gas pressure of the ECR discharge is in the range of from 1.3 to 13.3 Pa (1 to 10 mTorr). Under such high vacuum, the mean free path of gas molecules is longer, such that the gas molecules perform a large number of reciprocating movements within the gas resonant time τ while being reflected by the inner wall surface of the etching chamber and by the wafer surface. If the resonant time is one second, the number of times of such reciprocating movements reaches the order of 1,000 for an average-sized etching chamber.

With the etching reaction system in which the ion-assist mechanism is in operation, the reaction possibility between radicals and surface particles is so high that it is predominantly the molecules of the etching reaction product rather than the etching gas molecules that perform the above-mentioned reciprocating movements a large number of times. According to the present invention, $SiBr_x$ is efficiently generated by the Si etching reaction being assisted by bromine radicals (Br*) based upon the ion assist mechanism by ions of the rare gas. In addition, the $SiBr_x$ molecules reside in the vicinity of the wafer surface for a prolonged time. Thus, with the etching process according to the present invention, deposition of $SiBr_x$ in the etched area is promoted as compared to the conventional etching process employing a plasma generated in a parallel flat plate RIE device under the gas pressure higher by one digit of magnitude than the above-mentioned gas pressure. That is, the cross-sectional profile of the pattern of the layer of the silicon-based material may be tapered sufficiently solely by the deposition of $SiBr_x$ without the necessity of adding the oxygen-based gas to the etching gas.

Since the main component of the deposit is now $SiBr_x$, particle contamination such as is caused by the $SiO_x$ deposit with the conventional etching method is no longer produced. On the other hand, since the deposit can be removed easily after the etching of the silicon layer, there is no risk of significant erosion of the underlying $SiO_x$ insulating film.

Of course, $SiO_x$ is by-produced as a deposit if the oxygen-based gas is added. However, since the main component of the deposit is $SiBr_x$, particle contamination or underlying layer selectivity is not so serious as with the conventional etching method.

In the dry etching method of the present invention, since the tapered etching of the layer of the silicon-based material may be performed as the effective etching mask width is increased by taking advantage of the deposit mainly composed of $SiBr_x$, it becomes possible to suppress particle contamination or erosion of the underlying insulating film to a minimum as compared to the conventional etching method and hence to improve the yield and reliability of the semiconductor device having the fine multi-layer interconnection structure.

DESCRIPTION OF THE PREFERRED EMBODIMENTS

Figure 1:
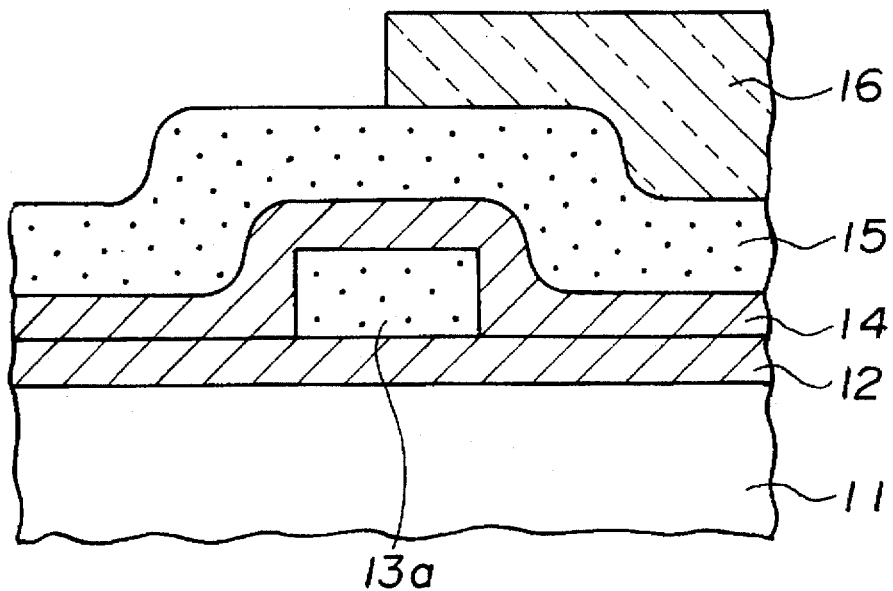
FIG. 1 is a schematic cross-sectional view showing the state in which a resist mask has been formed on an upper interconnection layer covering a patterned lower interconnection layer in the preparation of conventional multi-layer interconnection.
Figure 2:
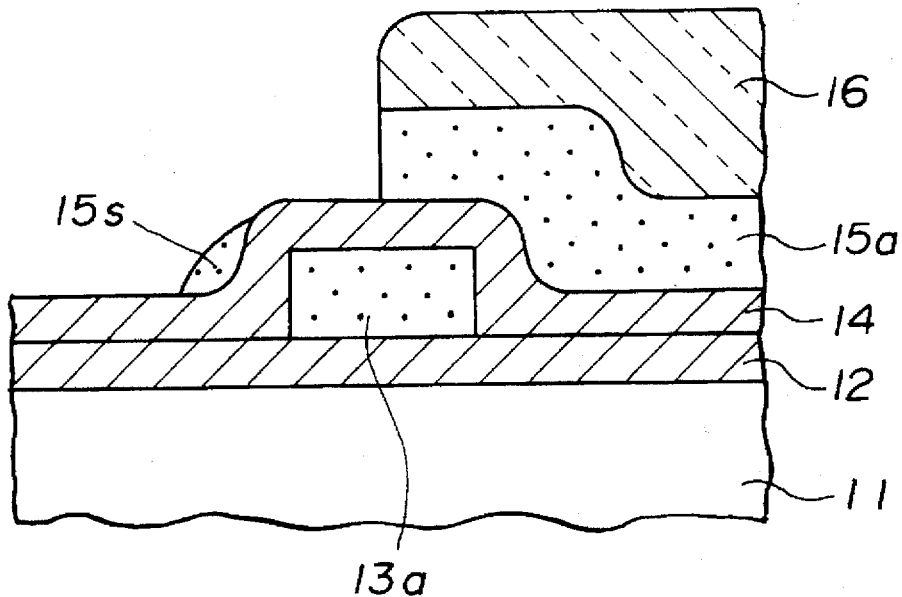
FIG. 2 is a schematic cross-sectional view showing the state in which the residue is left at a step region as a result of etching of the upper interconnection layer of FIG. 1.
Figure 3:
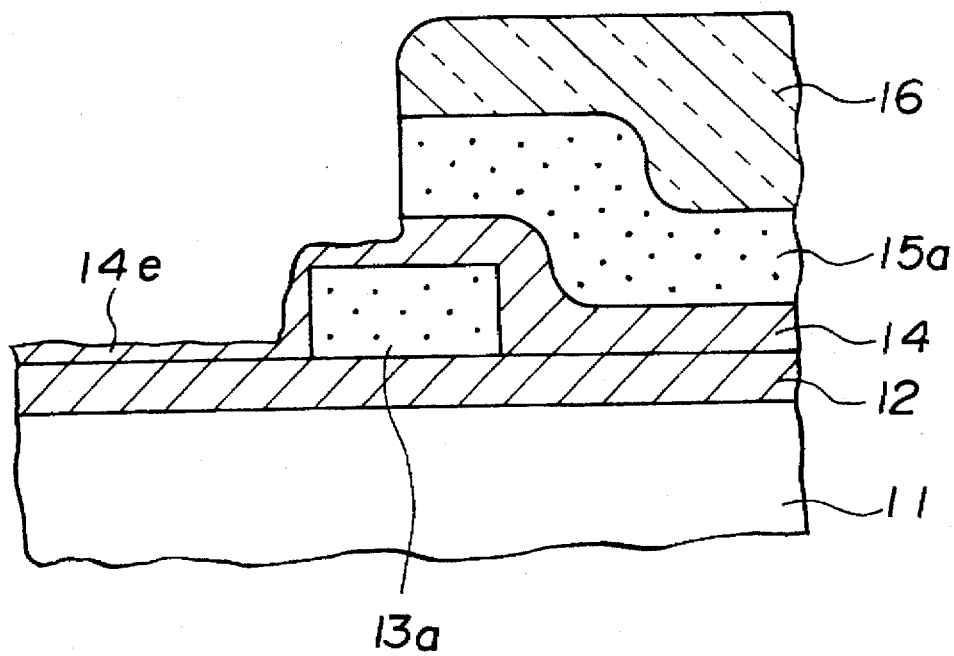
FIG. 3 is a schematic cross-sectional view showing the state in which the second gate oxide film has been eroded as a result of removal of the residue shown in FIG. 2.
Figure 4:
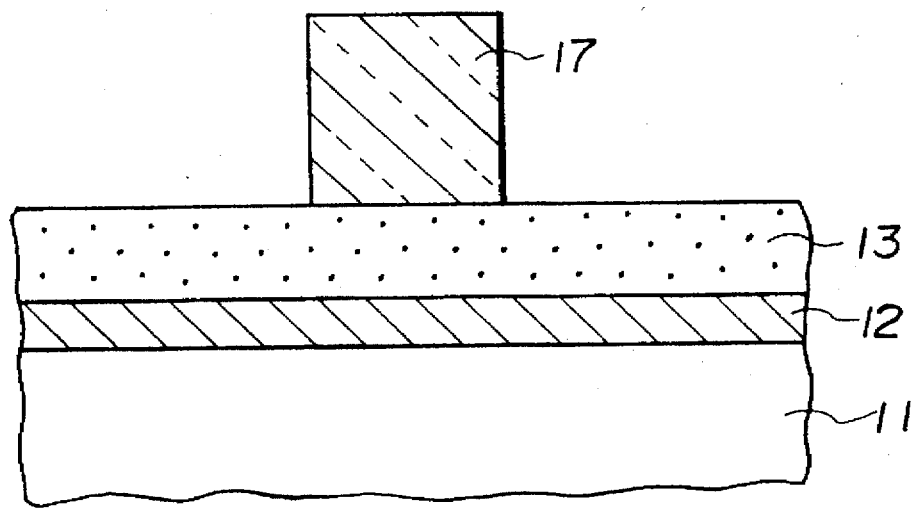
FIG. 4 is a schematic cross-sectional view showing the state in which a resist mask has been formed on a patterned lower interconnection layer in the preparation of conventional multi-layer interconnection.
Figure 5:
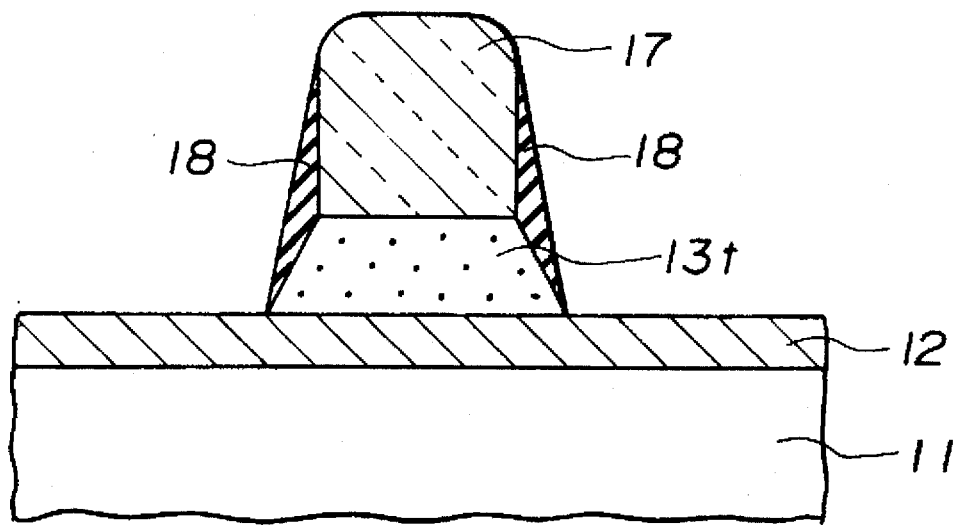
FIG. 5 is a schematic cross-sectional view showing the state in which the patterned lower interconnection layer of FIG. 4 has been etched to form a tapered lower interconnection pattern layer.
Figure 6:
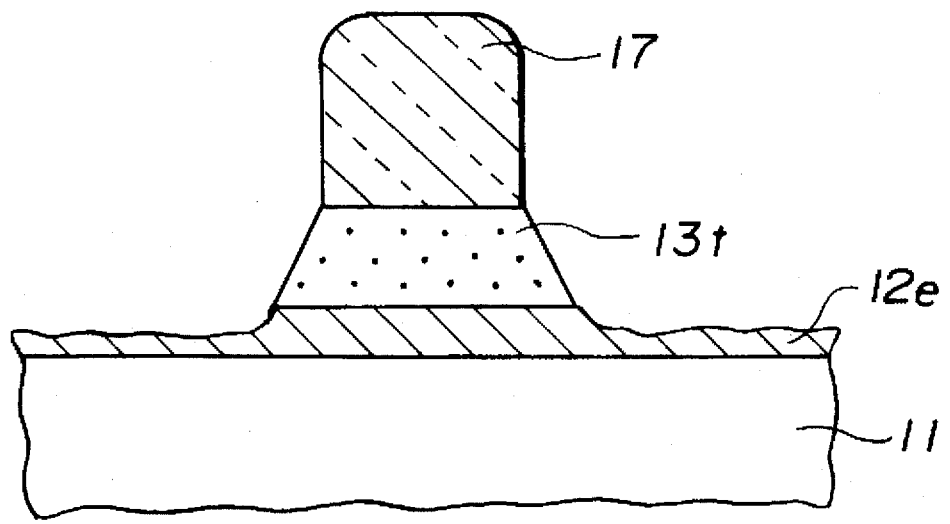
FIG. 6 is a schematic cross-sectional view showing the state in which the first gate oxide film has been eroded as a result of removal of the sidewall protection film shown in FIG. 5.

Referring to the drawings, preferred embodiments of the present invention will be explained in detail.

EXAMPLE 1

Figure 7:
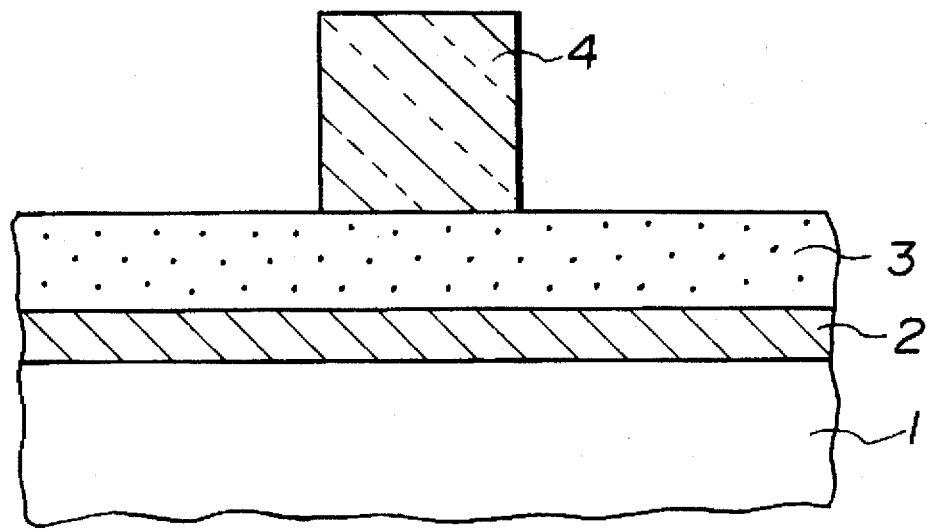
FIG. 7 is a schematic cross-sectional view showing the state in which, in an embodiment of the present invention as applied to the gate electrode processing of the CCD, a gate insulating film, a first polysilicon layer and a resist mask have been sequentially formed on an Si substrate.

In the present Example, the present invention is applied to processing of a CCD gate electrode, and tapered etching of the first polysilicon layer is performed using a HBr/Ar gas mixture. The process is explained by referring to FIGS. 7 to 9.

First, a gate insulating film 2 was formed on a Si substrate 1. The gate insulating film 2 was a $SiO_x$ film formed by thermal oxidation of the Surface of the Si substrate 1 or a so-called NON film having a $SiO_x/SiN_x/SiO_x$ three-layer structure. On the gate insulating film 2 was then formed a first polysilicon layer 3, to a film thickness of about 500 nm, by e.g. the usual CVD method under a reduced pressure. On the first polysilicon layer 3 was then formed a resist mask 4, profiled to the shape of the gate electrode pattern, through the processes of well-known resist coating, photolithography and development.

This wafer was then set an a magnetic micro-wave plasma etching device, and the area of the above-mentioned first polysilicon layer 3 not covered by the resist mask 4 was etched under the conditions of the HBr flow rate of 20 SCCM, an Ar flow rate of 100 SCCM, a gas pressure of 2.1 Pa, a microwave power of 850W (2.45 GHz), an RF bias power of 10 W (2 MHz) and a wafer-setting electrode temperature of 50° C. The etching device was of the type in which an ECR plasma was generated in a bell-jar type quartz chamber and a wafer was set facing this ECR plasma.

Figure 8:
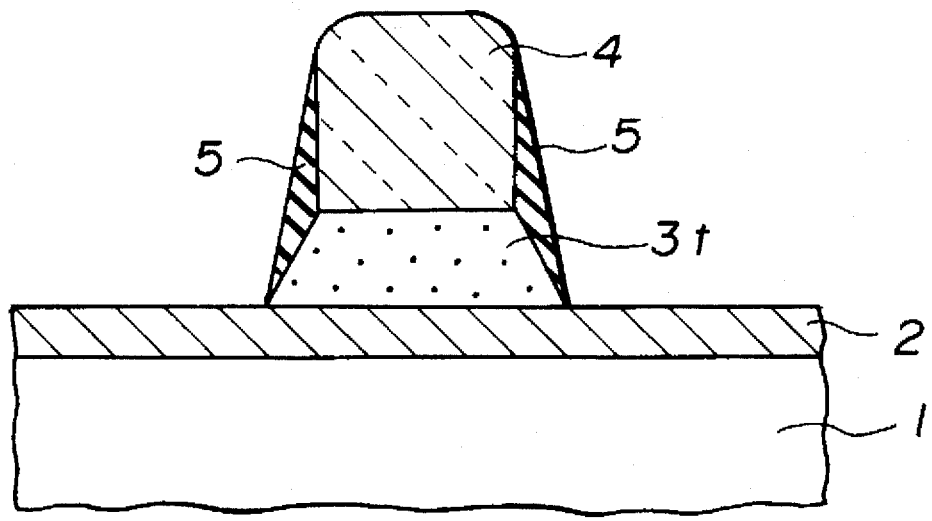
FIG. 8 is a schematic cross-sectional view showing the state in which a tapered gate electrode has been formed by etching the first polysilicon layer of FIG. 7.

By this process, etching proceeded for forming a gate electrode 3t having a tapered shape, at the same time as a sidewall protective film 5 was formed by a deposit mainly composed of SiBr, an etching reaction product, as shown in FIG. 8. If any oxygen is present in the etching reaction system, it is thought to be residual oxygen in the quartz chamber evacuated to a high vacuum. However, the oxygen quantity is only a trace quantity. Consequently, the sidewall protective film 5 is thought to be substantially free of oxygen.

Figure 9:
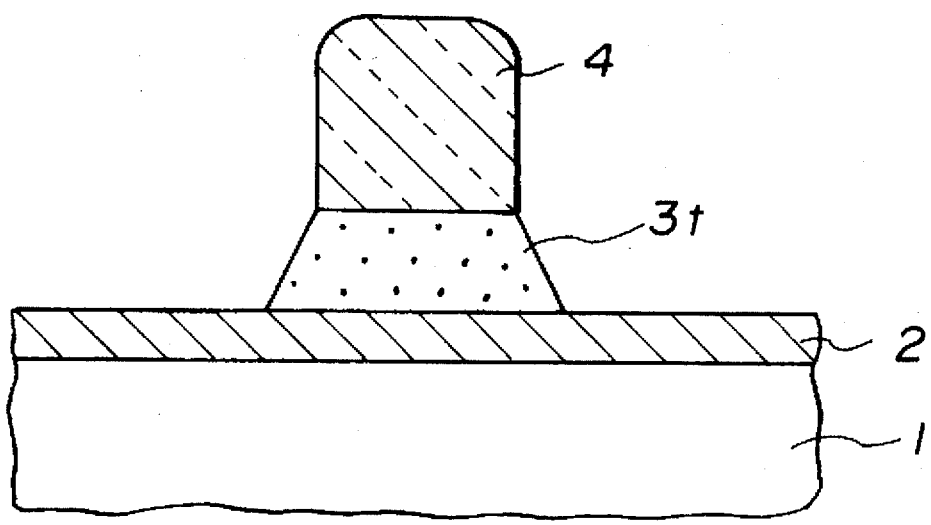
FIG. 9 is a schematic cross-sectional view showing the state in which the sidewall protective film shown in FIG. 8 has been removed.

The wafer was then transported into a post-processing chamber and processed with fluorine plasma processing using an $NF_3$ gas. In this manner, the sidewall protective film 5 could be easily removed, as shown in FIG. 9. Since the plasma processing could be completed in a shorter time, erosion of the gate insulating film 2, as was produced in the case of removing the $SiO_x$ based sidewall protective film in the conventional practice, was not produced.

The above-described process from the etching to the fluorine plasma processing was carried out using a multi-chamber system in which the magnetic micro-wave plasma etching device and the post-processing chamber were connected to each other by a vacuum transporting channel. By this process, highly excellent underlying layer selectivity could be achieved since oxidation of the sidewall protective film 5 by the exposure of the wafer to atmosphere was inhibited and hence the time required for fluorine plasma processing could be reduced significantly.

EXAMPLE 2

In the present Example, the gate electrode was processed in a similar manner to that in Example 1 using an $HBr/Ar/O_x$ gas mixture.

In the present Example, the same sample wafer as that used in Example 1 was used, and $O_2$ was added to the gas composition explained in Example 1 at a flow rate of 5 SCCM.

By this etching, a gate electrode 3t having a tapered profile was formed at the same time as a sidewall protection film 5 composed mainly of $SiBr_x$ and a minor quantity of $SiO_x$ was formed. In the present Example, the taper angle could be controlled over a wide range because the sidewall protective film 5 was improved in depositability more significantly than in the process in Example 1.

After the end of the etching, the fluorine plasma processing was carried out using an $NF_3$ gas for quickly removing the sidewall protective film 5. In the present Example, since a trace amount of $SiO_x$ was contained in the sidewall protective film 5, the plasma processing time required was slightly longer than in Example 1. However, the plasma processing time required was markedly shorter than in the conventional process. Thus the erosion of the gate insulating film could be suppressed to a practically unobjectionable level.

What is claimed is:

1. A method for dry etching of a layer of silicon-based material on a substrate comprising the steps of:

forming a mask layer on the layer of the silicon-based material for exposing an area to be etched;

etching the exposed area by providing an etching gas consisting of a bromine-based gas, an oxygen-based gas and a rare gas with a rate of flow of the rare gas being more than a rate of flow of the bromine-based gas, creating an ECR plasma with the etching gas under a gas pressure of 1.3 to 13.3 Pa to etch the exposed area while depositing a deposit composed mainly of silicon bromide on sidewalls created by the etching and controlling the amount of oxygen-based gas to limit the amount of oxygen in the deposit, and then removing the deposit on the sidewalls with a fluorine plasma process.

2. A method according to claim 1, wherein said etching produces an etched silicon-based layer with a tapered cross-section.

3. A method according to claim 1, wherein the fluorine plasma process used a $NF_3$ gas plasma.

4. A method according to claim 1 which include preforming the etching step in a magnetic micro-wave plasma etching device and the method includes transporting the etched substrate from the plasma etching device to a post-processing chamber where the step of removing is preformed.

5. A method according to claim 1 wherein the rare gas is argon.

6. A method according to claim 5 wherein the step of etching is performed in a chamber of a magnetic microwave plasma electron device and the method includes transporting the etched substrate from the etching device to a post-processing chamber where the step of removing is preformed.

7. A method for dry etching of a layer of silicon-based material on a substrate comprising the steps of:

forming a mask layer on the layer of the silicon-based material for exposing an area to be etched;

etching the exposed area by providing an etching gas consisting of a bromine-based gas and a rare gas with a rate of flow of the rare gas being more than a rate of flow for the bromine-based gas, creating an ECR plasma with the etching gas under a gas pressure of 1.3 to 13.3 Pa to etch the exposed area while depositing a deposit composed mainly of silicon bromide on sidewalls created by the etching, and then removing the deposit of silicon bromide by a fluorine plasma process.

8. A method according to claim 7 wherein said etching produces an etched silicon-based layer with a tapered cross-section.

9. A method according to claim 7 wherein the fluorine plasma process uses a $NF_3$ gas plasma.

10. A method according to claim 7, wherein the rare gas is argon.

11. A method according to claim 10 which include preforming the etching step in a magnetic micro-wave plasma etching device and the method includes transporting the etched substrate from the plasma etching device to a post-processing chamber where the step of removing is preformed.

12. A method according to claim 7 wherein the step of etching is performed in a chamber of a magnetic microwave plasma electron device and the method includes transporting the etched substrate from the etching device to a post-processing chamber where the step of removing is preformed.

* * * * *